United States Patent
Haartsen

(10) Patent No.: US 7,224,305 B2
(45) Date of Patent: May 29, 2007

(54) ANALOG-TO-DIGITAL MODULATION

(75) Inventor: Jacobus C. Haartsen, Hardenberg (NL)

(73) Assignee: Telefonaktiebolaget L M Ericsson (publ), Stockholm (SE)

( * ) Notice: Subject to any disclaimer, the term of this patent is extended or adjusted under 35 U.S.C. 154(b) by 0 days.

(21) Appl. No.: 11/021,140

(22) Filed: Dec. 24, 2004

(65) Prior Publication Data
US 2005/0270202 A1    Dec. 8, 2005

Related U.S. Application Data

(60) Provisional application No. 60/577,596, filed on Jun. 8, 2004.

(51) Int. Cl.
*H03M 1/12* (2006.01)
(52) U.S. Cl. .................. 341/155; 341/131; 341/143
(58) Field of Classification Search ................ 341/131, 341/143, 155
See application file for complete search history.

(56) References Cited

U.S. PATENT DOCUMENTS

| | | | | |
|---|---|---|---|---|
| 3,706,941 A | * | 12/1972 | Cohn | 331/78 |
| 4,034,367 A | * | 7/1977 | Sugiyama et al. | 341/131 |
| 4,169,249 A | * | 9/1979 | Hoffmann et al. | 331/78 |
| 4,176,399 A | * | 11/1979 | Hoffmann et al. | 708/250 |
| 4,965,668 A | * | 10/1990 | Abt et al. | 348/574 |
| 4,968,987 A | | 11/1990 | Naka et al. | |
| 5,010,347 A | * | 4/1991 | Yukawa | 341/143 |
| 5,073,777 A | * | 12/1991 | Fukuhara et al. | 341/131 |
| 5,252,973 A | * | 10/1993 | Masuda | 341/131 |
| 5,408,233 A | * | 4/1995 | Gannon et al. | 341/131 |
| 5,497,154 A | * | 3/1996 | Komamura | 341/131 |
| 5,525,984 A | * | 6/1996 | Bunker | 341/131 |
| 6,173,003 B1 | * | 1/2001 | Whikehart et al. | 375/130 |
| 6,195,669 B1 | * | 2/2001 | Onodera et al. | 708/3 |
| 6,320,526 B1 | | 11/2001 | Gandolfi et al. | |
| 6,337,643 B1 | * | 1/2002 | Gabet et al. | 341/131 |
| 6,443,723 B1 | * | 9/2002 | Buttigieg | 425/214 |
| 6,515,542 B1 | * | 2/2003 | Wang et al. | 330/69 |
| 6,556,158 B2 | * | 4/2003 | Steensgaard-Madsen | 341/131 |

(Continued)

FOREIGN PATENT DOCUMENTS

EP    0515154 A1    11/1992

(Continued)

OTHER PUBLICATIONS

PCT International Search Report, dated Sep. 20, 2005, in connection with International Application No. PCT/EP2005/005556.

(Continued)

*Primary Examiner*—Khai M. Nguyen
(74) *Attorney, Agent, or Firm*—Potomac Patent Group PLLC

(57) ABSTRACT

A supplied analog signal is modulated by comparing the supplied analog signal with a noise signal. As a result of each comparison, an output signal is generated having a first value if the supplied analog signal is greater than the noise signal and generating an output signal having a second value if the supplied analog signal is lower than the noise signal. Such modulation is useful in applications such as analog-to-digital conversion. The transfer function of the modulator is a function of the distribution of the noise source.

11 Claims, 5 Drawing Sheets

U.S. PATENT DOCUMENTS

| | | | | |
|---|---|---|---|---|
| 6,571,263 | B1* | 5/2003 | Nagai | 708/3 |
| 6,857,003 | B2* | 2/2005 | Saito | 708/801 |
| 6,898,214 | B1* | 5/2005 | Sinsky et al. | 370/469 |
| 6,906,649 | B2* | 6/2005 | Fletcher et al. | 341/131 |
| 7,007,060 | B2* | 2/2006 | Miller, Jr. | 708/801 |
| 7,099,906 | B2* | 8/2006 | Messina et al. | 708/255 |

FOREIGN PATENT DOCUMENTS

| | | |
|---|---|---|
| EP | 0645893 A1 | 3/1995 |

OTHER PUBLICATIONS

PCT Written Opinion, dated Sep. 20, 2005, in connection with International Application No. PCT/EP2005/005556.

Lerch, H.P. "Gesichtspunkte zur Optimierung eines Analog-Stochastik-Codierers" Frequenz, vol. 32, No. 11, Nov. 1978, XP008052181, Berlin, DE.

"Sadistical design philosophies yield prototype 64-bit, 10-sec ADC" EDN Electrical Design News, vol. 25, No. 7, Apr. 5, 1980, XP008052184 Denver, US.

Hirsch, J. -J. "Un nouveau procédé de conversion numérique-analogique à signaux stochastiques" Électronique et Microélectronique Industrielles, No. 155, Apr. 15, 1972, XP008052186, Paris, FR.

PCT International Preliminary Report on Patentability, dated Jul. 5, 2006, in connection with International Application No. PCT/EP2005/005556.

* cited by examiner

ANALOG-TO-DIGITAL MODULATION

CROSS REFERENCE TO RELATED APPLICATIONS

This application claims the benefit of U.S. Provisional Application No. 60/577,596, filed Jun. 8, 2004, which is hereby incorporated herein by reference in its entirety.

BACKGROUND

The invention relates to signal modulators, and more particularly to modulation techniques useful for converting an analog signal into a digital signal.

Today's information age would not have been possible without the existence of digital technology. The huge amount of storage, communications, and information processing that now goes on continuously throughout the world relies on the fact that representation of information can be reduced to ones and zeroes. Moore's law, stating that every 18 months the amount of transistors per area is doubled, or the cost is halved, still seems to remain valid. Yet, our daily lives are filled with analog signals; that is, signals that are continuous in time and continuous in amplitude. Nyquist has shown that signals whose frequency bandwidth is limited can be made time-discrete (i.e., represented only by values associated with distinct points in time) if the rate of sampling is sufficiently large. In addition, signals can be made amplitude discrete (i.e., represented only by values selected from a fixed set of values, eliminating any possibility of any values lying "in-between" any of the values in the fixed set) by quantizing to discrete levels. In applications such as communications, the number of bits in the quantization is determined by the required signal-to-noise ratio (SNR) conditions since quantization adds quantization noise.

It can be appreciated, then, that the interface between the analog world and the digital world is crucial for the success of digitally processing analog information. In the past, a lot of attention has been paid to analog-to-digital (A/D) converters and A/D modulators. Depending on the required speed (bandwidth of the input signal) and the required SNR, different A/D concepts can be used. Examples include successive approximation A/D, flash A/D, delta modulation, and sigma-delta modulation. These well-known techniques will now be briefly discussed.

Successive approximation is a low cost concept that can be used when the number of bits per sample has to be large. However conversion per sample takes quite a long time and the concept is not attractive for input signals with a large bandwidth.

Flash converters are extremely fast, but have high power consumption and are expensive.

Delta modulation and sigma-delta modulation techniques have become very popular as they use simple implementations and show fairly good performance. In delta modulation, the input signal is followed in a step-wise fashion: for every detected increase in the input signal, the output is increased by a fixed step size; for every detected decrease in the input signal, the output is likewise decreased by a fixed step size. Delta modulation is limited in bandwidth and amplitude because of slope overload. Slope overload occurs when the magnitude of the rise (or fall) in the input signal is larger than the steps can follow. Using larger steps compromises the SNR at smaller signal levels because the quantization levels are coarser.

Sigma-delta modulators do not have this limitation. In these modulators, the average of the binary output represents the input level. Sigma-delta modulators require a large oversampling rate in order to reduce the variation in this average.

Sigma-delta modulators are commonly used for high-performance audio and video applications. They have a few disadvantages though. For one thing, a feedback loop is used in sigma-delta modulators. The circuitry in the loop runs at the oversampling rate and can therefore consume quite a lot of power. Moreover, the loop can become unstable and may exhibit limit cycles. Additionally, the oversampling rate must be much higher than the bandwidth of the signal being sampled. Because of limits on how high the oversampling rate can be, the signal bandwidth cannot be extremely large. Furthermore, since the sigma-delta modulation introduces noise shaping, moving noise into the higher frequency area, rather extensive low-pass filtering in the digital domain is required to prevent aliasing during the down-sampling. (Down-sampling is a process whereby the number of samples representing a signal is reduced, as though the signal had been originally sampled at a slower sampling rate.)

SUMMARY

It should be emphasized that the terms "comprises" and "comprising", when used in this specification, are taken to specify the presence of stated features, integers, steps or components; but the use of these terms does not preclude the presence or addition of one or more other features, integers, steps, components or groups thereof.

A supplied analog signal is modulated according to various embodiments. In accordance with an aspect of various embodiments, modulating the supplied analog signal includes comparing the supplied analog signal with a noise signal. As a result of each comparison, an output signal is generated having a first value if the supplied analog signal is greater than the noise signal and generating an output signal having a second value if the supplied analog signal is lower than the noise signal.

In some embodiments, the noise signal is generated by a noise source such that the noise signal value has a uniform probability distribution. For example, the probability density function, p(z), of the noise signal value, z, may be given by $$p(z) = \frac{1}{2d}, \text{ for } -d < z < d$$

where d is a positive number.

In alternative embodiments, the noise signal is generated by a noise source such that the noise signal value has a normal distribution. For example, the probability density function p(z), of the noise signal value, z, may be given by $$p(z) = \frac{1}{\sigma\sqrt{2\pi}} \cdot e^{-z^2/2\sigma^2} dz,$$

where $\sigma$ is the standard deviation of the normal distribution.

In some embodiments, the noise signal is thermal noise. This may be, for example, generated by one or more electronic components in the noise source. In some embodiments, at least one of the one or more electronic components is a resistor.

In another aspect, the noise signal may be generated by first generating a low level noise signal, and then amplifying the low level noise signal. In some of these embodiments, amplifying the low level noise signal comprises adding additional noise to the low level noise signal such that the resultant noise signal value maintains a normal distribution.

In yet another aspect, where a transfer function of the modulation is non-linear, additional processing is performed to linearize a set of output signals generated by the modulation. This may be done by, for example, using a look-up table to replace output signal values with new values.

In still another aspect, the noise signal may have a white spectrum. In alternative embodiments, the noise signal may have a colored spectrum.

In some embodiments using the colored spectrum, the colored spectrum of the noise signal does not contain power in a frequency region occupied by a spectrum of the supplied analog signal.

In yet another aspect, modulating the supplied analog signal may involve generating the noise signal by filtering an initial noise signal by a high-pass filter. Alternatively, modulating the supplied analog signal may involve generating the noise signal by filtering an initial noise signal by a notch filter.

BRIEF DESCRIPTION OF THE DRAWINGS

The objects and advantages of the invention will be understood by reading the following detailed description in conjunction with the drawings in which.

DETAILED DESCRIPTION

Figure 1:
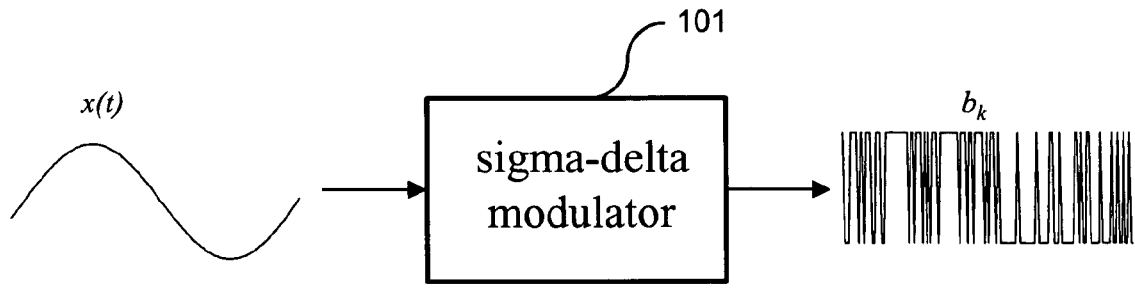
FIG. 1 is a simple representation of a sigma-delta modulator.

The various features of the invention will now be described with reference to the figures, in which like parts are identified with the same reference characters.

The various aspects of the invention will now be described in greater detail in connection with a number of exemplary embodiments. To facilitate an understanding of the invention, many aspects of the invention are described in terms of sequences of actions to be performed by elements of a computer system. It will be recognized that in each of the embodiments, the various actions could be performed by specialized circuits (e.g., discrete logic gates interconnected to perform a specialized function), by program instructions being executed by one or more processors, or by a combination of both. Moreover, the invention can additionally be considered to be embodied entirely within any form of computer readable carrier, such as solid-state memory, magnetic disk, optical disk or carrier wave (such as radio frequency, audio frequency or optical frequency carrier waves) containing an appropriate set of computer instructions that would cause a processor to carry out the techniques described herein. Thus, the various aspects of the invention may be embodied in many different forms, and all such forms are contemplated to be within the scope of the invention. For each of the various aspects of the invention, any such form of embodiments may be referred to herein as "logic configured to" perform a described action, or alternatively as "logic that" performs a described action.

The various embodiments described herein illustrate modulators and modulation techniques that do not require a feedback loop. The resulting concepts allow a much larger bandwidth to be sampled at lower power consumption. An added benefit is that the realization of these techniques is very simple. An overview now follows:

The modulators (and modulation techniques) presented here have two components: a comparator (comparison) and a noise source (noise generation). In exemplary embodiments the analog signal to be modulated is supplied to the positive node of the comparator and the noise signal to the negative node. If the noise signal is larger than the supplied analog signal, the comparator output will be a binary −1; if the noise signal is smaller than the supplied analog signal, the comparator output will be a binary +1, As a result, the comparator output switches between values of +1 and −1 and the average of the output string of values is a measure for the input level. The transfer function is determined by the amplitude distribution of the noise source. One could call this A/D modulator a "stochastic A/D modulator" or simply "stochastic modulator", since it utilizes a random noise source as one of its inputs. The bandwidth of the system is determined by the bandwidth of the noise source and the bandwidth of the comparator. Preferably the noise source is white over the frequency range of interest. This modulator can be realized at very low cost and can provide extremely high data rates. Since no noise shaping is applied, application of the stochastic A/D modulator for use in A/D converters imposes only moderate requirements on the decimation filters and much lower power consumption can be achieved. As no feedback loop is present, the system is stable, even at very high frequencies, and does not show limit-cycles or idle tones. These and other aspects of the invention will now be described in even greater detail.

Sigma-delta modulators are derived from delta modulators, so the discussion will start with these. Delta modulators generate a binary bit stream that tracks the derivative of the supplied analog signal. When it is desired to regenerate the supplied analog signal, a delta demodulator integrates and then low-pass filters the bit stream.

A sigma-delta modulator is derived by moving the integrator of the delta demodulator to the input of the delta modulator. Because in this arrangement the delta modulator is preceded by an integrator, the name sigma-delta modulator is applied. The demodulator of a sigma-delta modulator-generated signal is then reduced to just a low-pass filter. Therefore, as illustrated in FIG. 1, the sigma-delta modulator 101 can be considered as a black box whose input receives an analog signal x(t), and whose output is a bit stream $b_k$. The average of the bit stream $b_k$ (as determined over a limited number of bits) represents the value of x(t). In order to have the average output at any moment sufficiently approach the corresponding analog input value, the number of bits that define a single sample value must be large. In sigma-delta modulators, high oversampling rates are applied to improve the SNR.

Figure 2A:
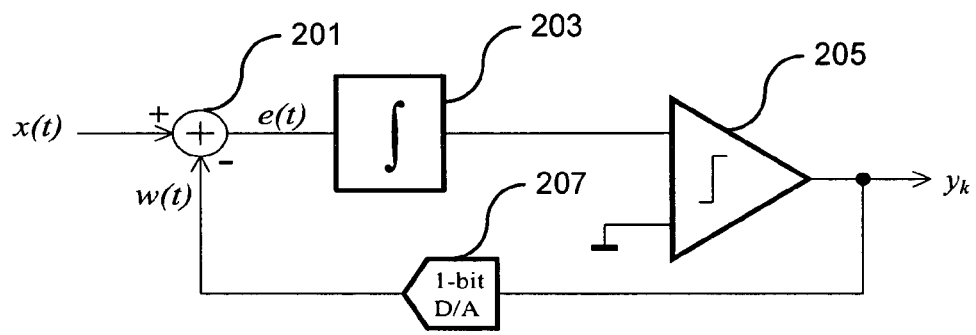
FIG. 2a is a block diagram of a conventional first-order sigma-delta modulator.

A block diagram of a very simple first order sigma-delta modulator is shown in FIG. 2a, The analog signal x(t) is supplied to a differencing unit 201, which generates an error signal, e(t), that represents the difference between the supplied analog signal x(t) and an analog feedback signal, w(t). (The analog feedback signal w(t) is described in greater detail below.) The error signal e(t) is supplied to an (analog) integrator 203, whose output is then quantized by, for example, a hard-limiter or comparator 205. This has the effect of quantizing the integrator output signal to a single bit, which is supplied as the output, $y_k$ of the sigma-delta modulator.

The quantized output $y_k$ is also fed back to the minus input of the differencing unit 201 via a 1-bit digital-to-analog (D/A) converter 207. As mentioned earlier, the output, w(t), of the D/A converter 207 is subtracted from the supplied analog signal x(t) which results in the error signal e(t).

Figure 2B:
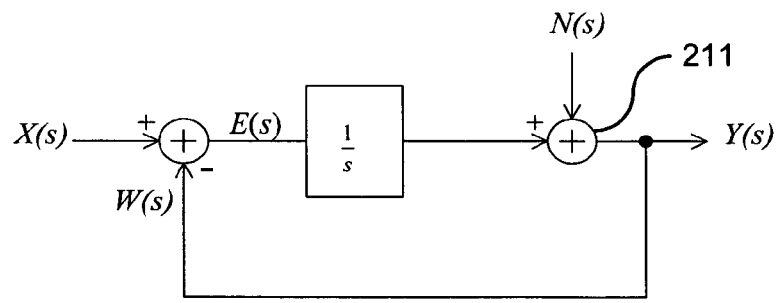
FIG. 2b is a linearized model of a conventional first-order sigma-delta modulator.

The effect of this feedback is to drive the average value of w(t) to be equal to the supplied analog signal x(t) in order to force the (accumulated) error signal e(t) to zero. A linearized model of the 1st order sigma-delta converter is shown in FIG. 2b, In the model, the Laplace transform equivalents of the signals and operations are shown. The quantizer 205 adds quantization noise, N(s), and is represented as a noise adder 211. From FIG. 2b one can derive that the sigma-delta modulator, operating as an A/D converter, works like a low-pass filter for the supplied signal X(s) with a signal transfer function of $$\frac{Y(s)}{X(s)} = \frac{1}{s+1}$$

whereas it acts like a high-pass filter for noise, N(s):

$$\frac{Y(s)}{X(s)} = \frac{s}{s+1}$$

Figure 3:
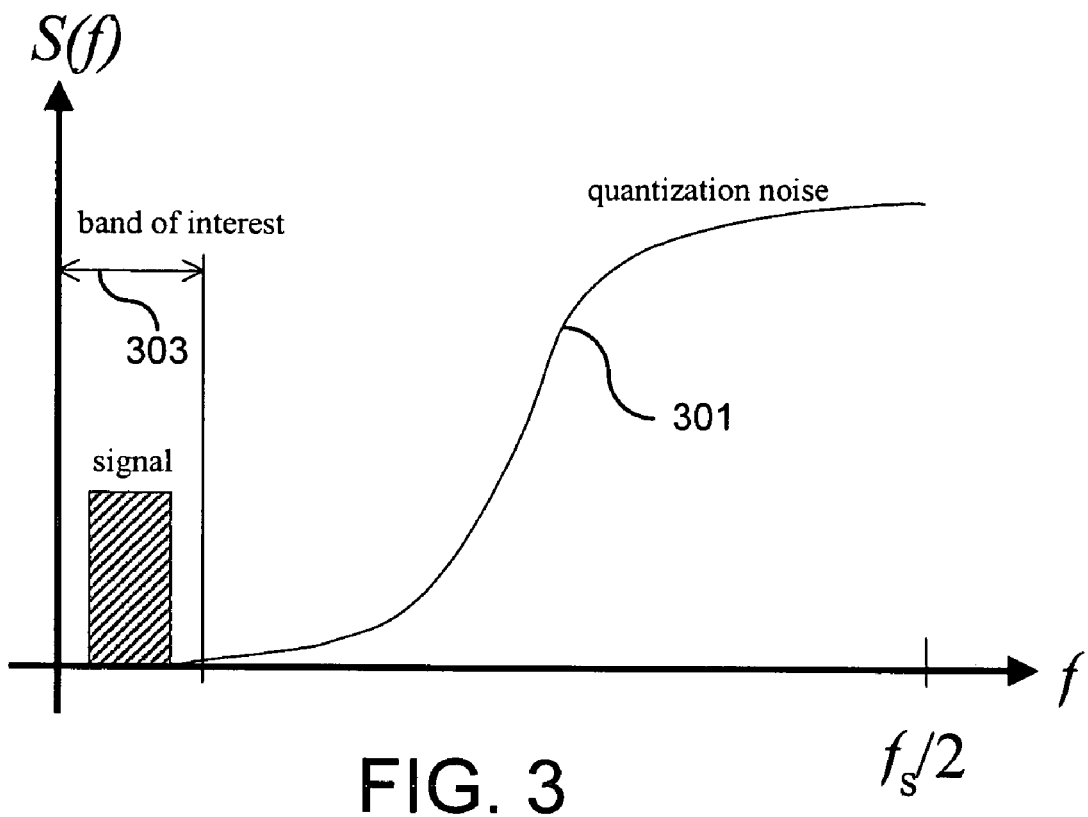
FIG. 3 is a graph illustrating the noise shaping effect of a first-order sigma-delta modulator.

The consequences of this high-pass filtering are shown in FIG. 3, which is a graph depicting the spectrum of the output of the sigma-delta modulator. The noise 301 is moved away from the lower frequencies 303 into the higher frequencies. Sigma-delta A/D converters make use of the fact that a high SNR can be obtained in the band of interest, that is the frequency band from DC up to some maximum frequency determined by the bandwidth of the supplied analog signal x(t). Note that the Nyquist frequency is normally much higher than this maximum frequency because of the oversampling applied. Before the digital signal can be down sampled, the noise at higher frequencies has to be suppressed by filtering in the digital domain to prevent aliasing. Decimation filters are used to suppress high frequency noise. Higher-order sigma-delta A/D converters can be used to further improve the SNR in the signal bandwidth. This comes at the expense of more high frequency noise which in turn requires sharper decimation filters after the A/D converter to obtain sufficient suppression. Since the first part of the decimation filters run at the oversampling rate, this can cause quite a lot of power consumption. Furthermore, the feedback loops in the conventional sigma-delta converters can become unstable, and can show limit-cycles and idle tones, whereby for a constant input signal, the output shows a repetitive behavior. This may show up as extra disturbance in the band of interest which cannot be filtered out. One may have to apply dithering to x(t) or w(t) in order to remove the limit cycles.

Figure 4:
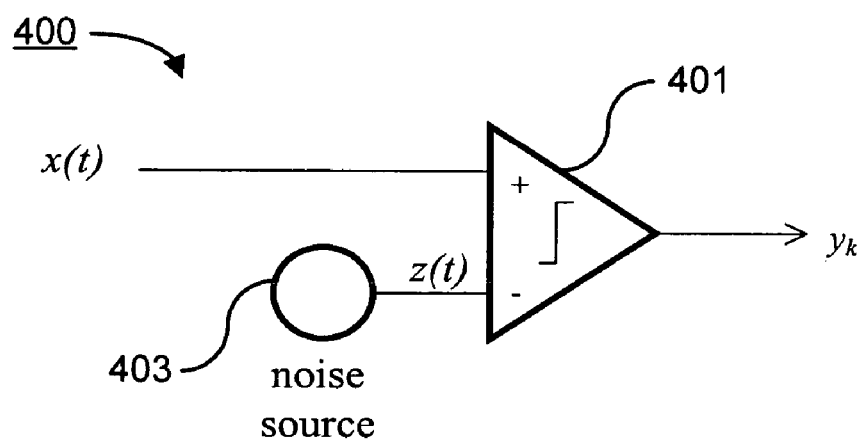
FIG. 4 is a block diagram of an exemplary implementation of a stochastic modulator in accordance with the invention.

A new approach for an A/D modulator which does not have the shortcomings mentioned above is the stochastic modulator, an example of which is shown in FIG. 4, In this embodiment, the number of elements is essentially reduced to two: a comparator 401 and a noise source 403. The supplied analog signal x(t) is fed into the positive input port of the comparator 401 by means of logic that receives the supplied analog signal as schematically indicated in FIG. 4 by the line connecting x(t) to the positive input port of the comparator 401, whereas the noise, z(t), from the noise source 403 is fed into the negative input port. The output $y_k$ of the comparator 401 is the output of the modulator 400. The transfer function of this modulator 400 is determined by the probability density function p of the noise z(t).

Figure 5:
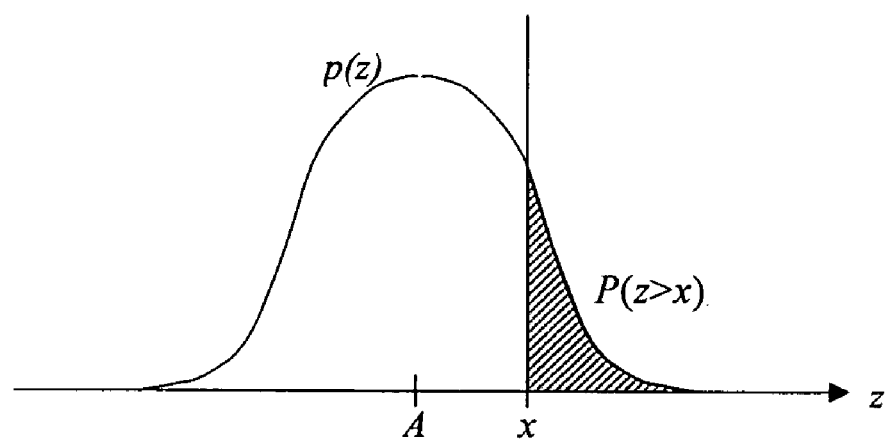
FIG. 5 is a graph that explains the transfer function of a stochastic A/D modulator using a probability density function.

Assume z to be a random variable with a probability density function p with a mean A and a function as shown in FIG. 5. The comparator 401 compares the random variable z with the present value of the supplied analog signal x and produces a 1 if z<x and a −1 if z>x. The average of the output $y_k$ of the modulator 400 will be $$y_{avg} = 1 \cdot P(z<x) + (-1) \cdot P(z>x).$$

Now, P(z<x) is the cumulative distribution function (CDF) of z or F(z). So the formula for the average output can also be written as:

$$y_{avg} = 2F(x) - 1.$$

Figure 6A:
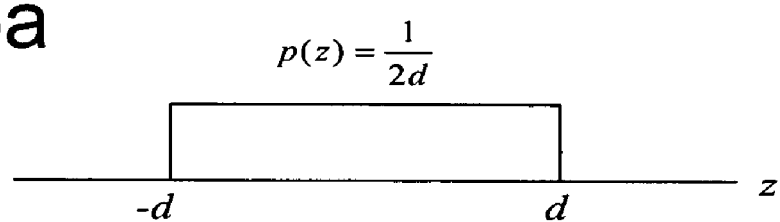
FIG. 6a is a graph illustrating a uniform amplitude distribution of a noise source used in a stochastic modulator.
Figure 6B:
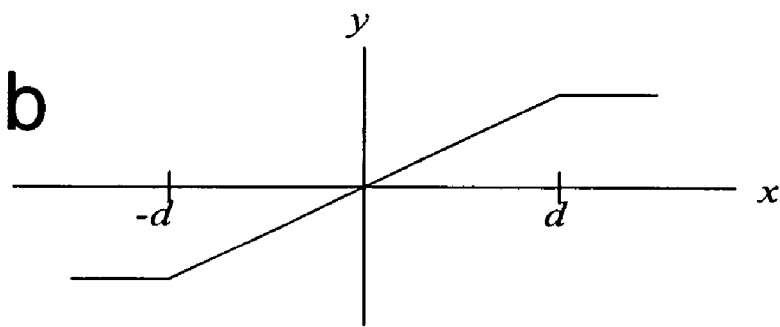
FIG. 6b is a graph illustrating the transfer function of a stochastic modulator using a noise source having a uniform amplitude distribution.

For a noise source with a uniform distribution (note A=0):

$$p(z) = \frac{1}{2d} \text{ for } -d < z < d,$$

the transfer function of the stochastic modulator is a linear curve x/d between −d and d. The uniform distribution of the noise source is illustrated in FIG. 6a, and the corresponding transfer function of the stochastic modulator is illustrated in FIG. 6b, As long as the supplied analog signal is within the range of [−d, d], no distortion of the signal is experienced.

Figure 7A:
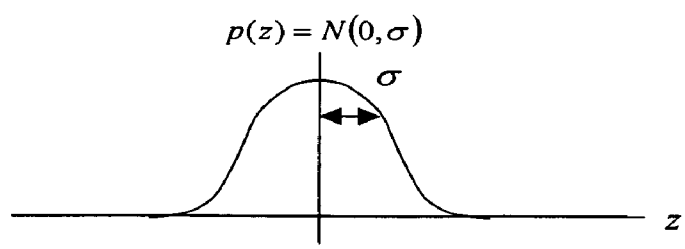
FIG. 7a is a graph illustrating a normal distribution.
Figure 7B:
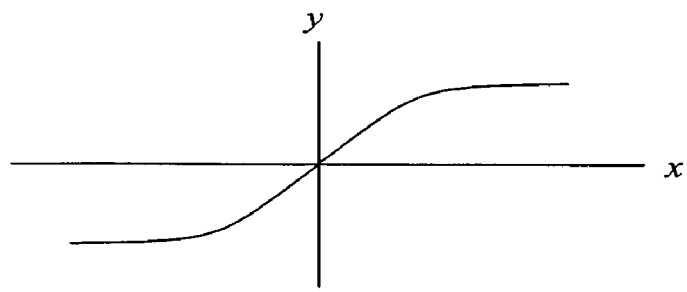
FIG. 7b is a graph depicting the transfer function of the stochastic modulator when the applied noise follows a normal distribution.

If the noise source has a normal distribution (also called Gaussian distribution), then for a random variable z, $$p(z) = \frac{1}{\sigma\sqrt{2\pi}} \cdot e^{-z/2\sigma^2} dz$$

which has a noise power of $\sigma^2$. It can be shown that the transfer function of this stochastic modulator becomes:

$$y = 1 - \text{erfc}\left(\frac{x}{\sigma\sqrt{2}}\right)$$

where erfc( ) is the error function, which is well known in probability, statistics and partial differential equations. FIG. 7a is a graph illustrating a normal distribution, and FIG. 7b is a graph depicting the transfer function of the stochastic modulator when the applied noise follows a normal distribution. It is clear that this is a non-linear transfer function. In essence, a compression takes place, as the amplification for larger input amplitudes decreases. Compression is generally applied for noise improvements (companding). The output can be made linear by expanding at a later stage in the digital domain. This can be achieved by a simple look-up table.

Figure 8:
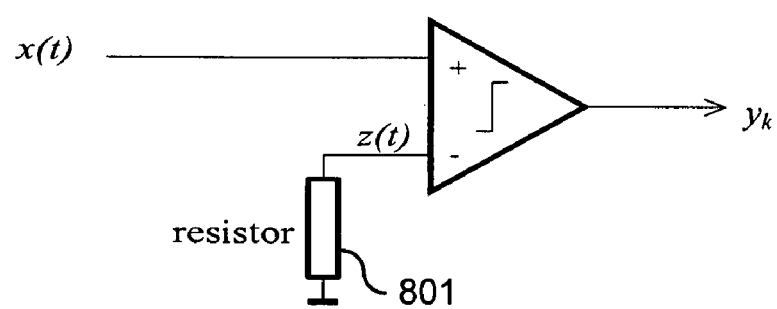
FIG. 8 is a block diagram of an exemplary stochastic modulator utilizing a resistor as a noise source, in accordance with the invention.

A noise source with a normal or Gaussian distribution is quite simple to implement. Any noise source in an electronic circuit shows a normal amplitude distribution which is proportional to the temperature. For example, a resistor R has a thermal noise source with a power of $$\sigma^2 = 4kTR$$

where k is the Boltzmann constant and T the temperature. An embodiment utilizing a resistor 801 as a noise source is illustrated in the block diagram of FIG. 8.

Since the input range of the stochastic modulator is determined by $\sigma$, one may want to amplify the noise output before it is fed to the comparator. It is permissible (although not necessary) for this amplification also to be very noisy. This stochastic modulator is very simple to implement at very low costs. If linearity is an issue, then determining how the noise added during amplification affects the transfer function enables the designer to include distortion compensation in the design.

In the stochastic modulator, no feedback loop is used. Therefore, it is inherently stable independent of the frequency. Very high bandwidths can be realized: the speed of the modulator is merely determined by the bandwidth of the noise source and that of the comparator. Since no feedback loop is applied, there is no noise shaping either. This means that the SNR in the band of interest will be lower than in conventional A/D modulators. However, the requirements on stopband rejection and sharpness of the decimation filters will be much less due to the decreased noise at higher frequencies. As a result, a high-speed A/D converter consuming less power can be built.

Applications are numerous and range from simple sensors, in which an analog input needs to be converted to a digital signal, all the way to advanced wireless and optical communications systems.

The invention has been described with reference to particular embodiments. However, it will be readily apparent to those skilled in the art that it is possible to embody the invention in specific forms other than those of the embodiment described above.

For example, in the above-described embodiments, the analog signal was supplied to a positive input port of a comparator, whereas a noise source was supplied to the negative input port of that comparator. Those of ordinary skill in the art will readily recognize that alternative embodiments can be realized in which the respective polarities of these signals is switched.

Figure 9:
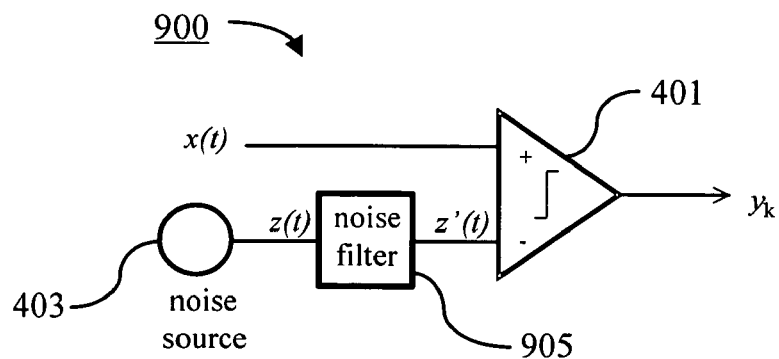
FIG. 9 is a block diagram of an alternative embodiment of an exemplary stochastic modulator.
Figure 10A:
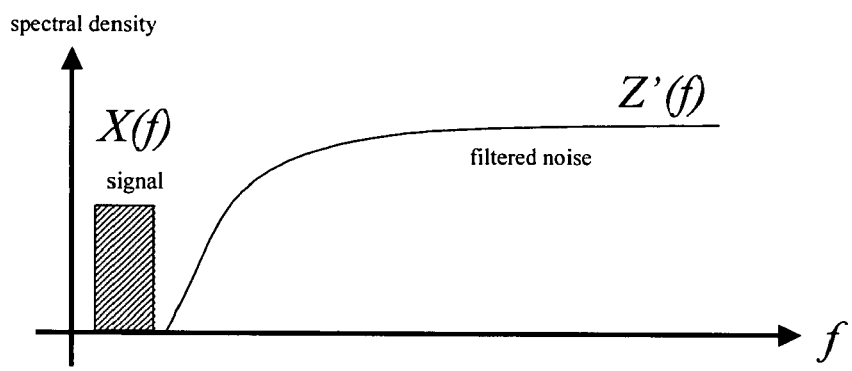
FIG. 10a is a graph of the frequency spectra X(f) of an input signal x(t) having frequency components around DC and the frequency spectra Z'(f) of a filtered noise signal z'(t) when the filter operates in accordance with a high pass function that removes noise components around DC.

In another example, the SNR of the system can greatly be improved by filtering the noise of the noise source. So far, the noise source 403 depicted in FIG. 4 has been assumed to be white. In FIG. 9, an alternative embodiment of a stochastic modulator 900 is shown in which an initial noise signal is filtered by a filter 905 before it is fed into the comparator 401. The filter function can be chosen such that noise is filtered away in the frequency band occupied by the supplied analog signal x(t). For example, when x(t) has frequency components around DC, a high pass function can be used in the filter 905 in order to remove noise components around DC. The frequency spectra X(f) of the supplied analog signal x(t) and Z'(f) of the filtered noise z'(t) are shown in FIG. 10a.

Figure 10B:
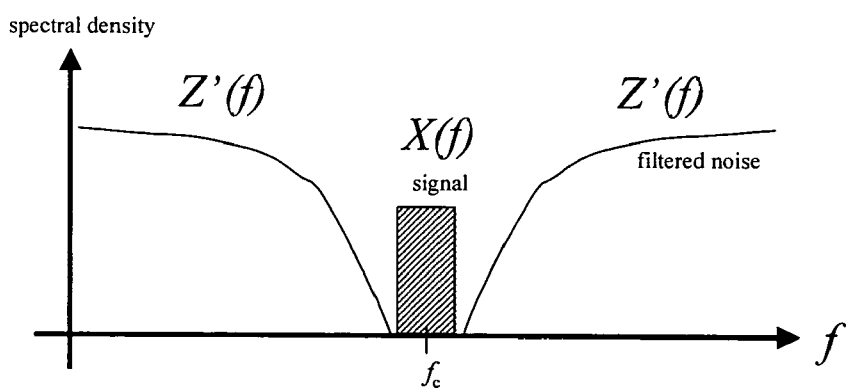
FIG. 10b is a graph of the frequency spectra X(f) of an input signal x(t) centered on a carrier $f_c$, and the frequency spectra Z'(f) of a filtered noise signal z'(t) when the filter operates in accordance with a notch function at $f_c$.

Alternatively, when the supplied analog signal x(t) is centered on a carrier $f_c$, a notch function at $f_c$ can be used for the filter 905. The corresponding spectra X(f) and Z'(f) are shown in FIG. 10b, The filter function can be obtained with passive components like capacitors, inductors, and resistors, or alternatively with active components as in $g_m C$ filters. Taking away frequency components in the noise source 403 that coincide with frequency components in the supplied analog signal x(t) will improve the SNR performance of the stochastic modulator considerably.

Note that these alternative embodiments differ from the traditional sigma-delta modulator noise shaping shown in FIG. 3 in that the noise power in the present embodiments is filtered and not moved from one frequency area to another frequency area. Moreover the stochastic modulator has a feed-forward architecture and the noise filtering can be done in a controlled way right after the noise source. Both low-pass and bandpass supplied analog signals can be treated, using high-pass or notch filters for filtering the noise, respectively.

Thus, the described embodiments are merely illustrative and should not be considered restrictive in any way. The scope of the invention is given by the appended claims, rather than the preceding description, and all variations and equivalents which fall within the range of the claims are intended to be embraced therein.

What is claimed is:

1. A method of modulating a supplied analog signal comprising:

comparing the supplied analog signal with a noise signal; and as a result of each comparison, generating an output signal having a first value if the supplied analog signal is greater than the noise signal and generating an output signal having a second value if the supplied analog signal is lower than the noise signal, wherein:

a transfer function of the method of modulating is non-linear; and the method further comprises linearizing a set of output signals generated by the method; and wherein linearizing the set of output signals generated by the method comprises using a look-up table to replace output signal values with new values.

2. A method of modulating a supplied analog signal to generate an output signal that is substantially related to the supplied analog signal in accordance with a transfer function, the method comprising:
  comparing the supplied analog signal with a noise signal; and
  as a result of each comparison, causing the output signal to have a first value if the supplied analog signal is greater than the noise signal and causing the output signal to have a second value if the supplied analog signal is lower than the noise signal,
  wherein the noise signal has a colored spectrum, and
  wherein the transfer function is substantially determined by an amplitude distribution of the noise signal.

3. The method of claim 2, wherein the colored spectrum of the noise signal does not contain power in a frequency region occupied by a spectrum of the supplied analog signal.

4. A method of modulating a supplied analog signal to generate an output signal that is substantially related to the supplied analog signal in accordance with a transfer function, the method comprising:
  comparing the supplied analog signal with a noise signal;
  as a result of each comparison, causing the output signal to have a first value if the supplied analog signal is greater than the noise signal and causing the output signal to have a second value if the supplied analog signal is lower than the noise signal; and
  generating the noise signal by filtering an initial noise signal by a high-pass filter,
  wherein the transfer function is substantially determined by an amplitude distribution of the noise signal.

5. A method of modulating a supplied analog signal to generate an output signal that is substantially related to the supplied analog signal in accordance with a transfer function, the method comprising:
  comparing the supplied analog signal with a noise signal;
  as a result of each comparison, causing the output signal to have a first value if the supplied analog signal is greater than the noise signal and causing the output signal to have a second value if the supplied analog signal is lower than the noise signal; and
  generating the noise signal by filtering an initial noise signal by a notch filter,
  wherein the transfer function is substantially determined by an amplitude distribution of the noise signal.

6. A modulator for modulating a supplied analog signal to generate an output signal that is substantially related to the supplied analog signal in accordance with a transfer function, the modulator comprising:
  logic that receives the supplied analog signal;
  a comparator that compares the supplied analog signal with a noise signal and that, as a result of each comparison, generates the output signal at a first value if the supplied analog signal is greater than the noise signal and generates an the output signal at a second value if the supplied analog signal is lower than the noise signal; and
  a noise generator for generating the noise signal, wherein the noise signal has a colored spectrum,
  wherein the transfer function is substantially determined by an amplitude distribution of the noise signal.

7. The modulator of claim 6, wherein the colored spectrum of the noise signal does not contain power in a frequency region occupied by a spectrum of the supplied analog signal.

8. An analog-to-digital converter comprising the modulator of claim 6.

9. A modulator for modulating a supplied analog signal to generate an output signal that is substantially related to the supplied analog signal in accordance with a transfer function, the modulator comprising:
  logic that receives the supplied analog signal;
  a comparator that compares the supplied analog signal with a noise signal and that, as a result of each comparison, generates the output signal at a first value if the supplied analog signal is greater than the noise signal and generates the output signal at a second value if the supplied analog signal is lower than the noise signal; and
  a high-pass filter that generates the noise signal by filtering an initial noise signal,
  wherein the transfer function is substantially determined by an amplitude distribution of the noise signal.

10. A modulator for modulating a supplied analog signal to generate an output signal that is substantially related to the supplied analog signal in accordance with a transfer function, the modulator comprising:
  logic that receives the supplied analog signal;
  a comparator that compares the supplied analog signal with a noise signal and that, as a result of each comparison, generates the output signal at a first value if the supplied analog signal is greater than the noise signal and generates the output signal at a second value if the supplied analog signal is lower than the noise signal; and
  a notch filter that generates the noise signal by filtering an initial noise signal,
  wherein the transfer function is substantially determined by an amplitude distribution of the noise signal.

11. An apparatus comprising:
  a modulator for modulating a supplied analog signal comprising:
    logic that receives the supplied analog signal; and
    a comparator that compares the supplied analog signal with a noise signal and that, as a result of each comparison, generates an output signal having a first value if the supplied analog signal is greater than the noise signal and generates an output signal having a second value if the supplied analog signal is lower than the noise signal,
    wherein a transfer function of the modulator is non-linear; and
  logic that linearizes a set of output signals generated by the modulator,
  wherein the logic that linearizes the set of output signals generated by the modulator comprises a look-up table having stored therein values used to replace output signal values.

* * * * *

UNITED STATES PATENT AND TRADEMARK OFFICE
CERTIFICATE OF CORRECTION

PATENT NO. : 7,224,305 B2 Page 1 of 1
APPLICATION NO. : 11/021,140
DATED : May 29, 2007
INVENTOR(S) : Haartsen It is certified that error appears in the above-identified patent and that said Letters Patent is hereby corrected as shown below:

On the Title Page, in Item (73), under "Assignee", in Column 1, Line 1, delete "L M" and insert -- LM --, therefor.

In Column 9, Line 55, in Claim 6, after "an" delete "the".

Signed and Sealed this

Ninth Day of September, 2008

JON W. DUDAS
*Director of the United States Patent and Trademark Office*